(12) United States Patent
Mizori

(10) Patent No.: US 7,777,064 B2
(45) Date of Patent: Aug. 17, 2010

(54) ADHESIVE COMPOSITIONS CONTAINING CYCLIC SILOXANES AND METHODS FOR USE THEREOF

(75) Inventor: Farhad G. Mizori, La Mesa, CA (US)

(73) Assignee: Designer Molecules, Inc., San Diego, CA (US)

( * ) Notice: Subject to any disclaimer, the term of this patent is extended or adjusted under 35 U.S.C. 154(b) by 1181 days.

(21) Appl. No.: 11/365,034

(22) Filed: Mar. 2, 2006

(65) Prior Publication Data
US 2007/0205399 A1    Sep. 6, 2007

(51) Int. Cl.
*C07F 7/08*    (2006.01)
(52) U.S. Cl. ...................... 556/460; 556/439
(58) Field of Classification Search ................. 556/460, 556/439
See application file for complete search history.

(56) References Cited

U.S. PATENT DOCUMENTS 4,944,989 A    7/1990    Dorsch 5,378,790 A    1/1995    Michalczyk et al.

FOREIGN PATENT DOCUMENTS

JP    05345880 A    * 12/1993
JP    10287715 A    * 10/1998

OTHER PUBLICATIONS

International Search Report for related application PCT/US06/07458, Aug. 31, 2006.

* cited by examiner

*Primary Examiner*—Elvis O Price
(74) *Attorney, Agent, or Firm*—The Law Office of Jane K. Babin, Professional Corporation; Jane K. Babin

(57) ABSTRACT

The invention is based on the discovery that certain well-defined functionalized cyclic siloxanes are useful as thermosetting resins for the electronic packaging industry. The functionalized cyclic siloxane compounds described herein can be cured in a variety of ways, depending on the polymerizable moiety incorporated into the compound. Invention cyclic siloxanes are readily prepared via hydrosilation of polyalkyl (hydro)cyclosiloxanes with appropriately functionalized alkenes and/or alkynes.

10 Claims, No Drawings

ADHESIVE COMPOSITIONS CONTAINING CYCLIC SILOXANES AND METHODS FOR USE THEREOF

FIELD OF THE INVENTION

The present invention relates generally to adhesive compositions, and more particularly to adhesive compositions containing cyclic siloxanes.

BACKGROUND OF THE INVENTION

Adhesive compositions, particularly conductive adhesives, are used for a variety of purposes in the fabrication and assembly of semiconductor packages and microelectronic devices. The more prominent uses include bonding of electronic elements such as integrated circuit chips to lead frames or other substrates, and bonding of circuit packages or assemblies to printed wire boards. Adhesives useful for electronic packaging applications typically exhibit properties such as good mechanical strength, curing properties that do not affect the component or the carrier, and thixotropic properties compatible with application to microelectronic and semiconductor components.

Adhesives used in the electronic packaging industry typically contain a thermosetting resin combined with a filler and some type of curing initiator. These resins are primarily used in the electronics industry for the preparation of non-hermetic electronic packages. Adhesives useful for electronic packaging applications typically exhibit properties such as good mechanical strength, curing properties that do not affect the function of the component or the carrier, and thixotropic properties compatible with application to microelectronic and semiconductor components. Examples of such packages are ball grid array (BGA) assemblies, super ball grid arrays, IC memory cards, chip carriers, hybrid circuits, chip-on-board, multi-chip modules, pin grid arrays, and the like.

For all these applications, the microelectronics industry continues to require new resins that are able to meet increasing demands and varying specifications. Accordingly, there is a need for the development of materials to address the requirements of this rapidly evolving industry.

SUMMARY OF THE INVENTION

The invention is based on the discovery that certain well-defined functionalized cyclic siloxanes are useful as thermosetting resins for the electronic packaging industry. The functionalized cyclic siloxane compounds described herein can be cured in a variety of ways, depending on the polymerizable moiety incorporated into the compound. Invention cyclic siloxanes are readily prepared via hydrosilation of polyalkyl (hydro)cyclosiloxanes with appropriately functionalized alkenes and/or alkynes.

In one embodiment of the invention, there are provided compounds having the structure:

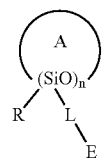

wherein:
  A is a siloxane ring,
  R is $C_1$ to about $C_{20}$ alkyl,
  each L is independently a substituted or unsubstituted alkylene, substituted or unsubstituted oxyalkylene, or covalent bond,
  at least one E is a polymerizable moiety, and
  n is 3 to about 6.

In another embodiment of the invention, there are provided adhesive composition including at least one compound as set forth above, and optionally at least one curing initiator.

In still another embodiment, there are provided die-attach pastes including
  a) 2 weight percent to about 98 weight percent (wt %) of at least one compound as set forth above, or combinations thereof, based on total weight of the composition.
  b) 0 to about 90 wt % of a filler;
  c) 0.1 wt % to about 5 wt % of at least one curing initiator, based on total weight of the composition;
  d) 0.1 wt % to about 4 wt %, of at least one coupling agent, based on total weight of the composition.

In still another embodiment, there are provided methods for attaching a semiconductor die to a substrate. Such methods can be performed, for example, by
  (a) applying the die attach paste set forth above to the substrate and/or the semiconductor die,
  (b) bringing the substrate and the device into intimate contact to form an assembly wherein the substrate and the device are separated only by the die-attach paste, and
  (c) subjecting the assembly to conditions suitable to cure the die-attach paste.

DETAILED DESCRIPTION OF THE INVENTION

It is to be understood that both the foregoing general description and the following detailed description are exemplary and explanatory only and are not restrictive of the invention claimed. As used herein, the use of the singular includes the plural unless specifically stated otherwise. As used herein, "or" means "and/or" unless stated otherwise. Furthermore, use of the term "including" as well as other forms, such as "includes," and "included," is not limiting. The section headings used herein are for organizational purposes only and are not to be construed as limiting the subject matter described.

Unless specific definitions are provided, the nomenclatures utilized in connection with, and the laboratory procedures and techniques of analytical chemistry, synthetic organic and inorganic chemistry described herein are those known in the art. Standard chemical symbols are used interchangeably with the full names represented by such symbols. Thus, for example, the terms "hydrogen" and "H" are understood to have identical meaning. Standard techniques may be used for chemical syntheses, chemical analyses, and formulation.

The invention provides functionalized cyclic siloxanes that are useful as thermosetting resins for the electronic packaging industry. The functionalized cyclic siloxanes described herein are prepared via hydrosilation of appropriately functionalized alkenes and/or alkynes with polyalkyl(hydro)cyclosiloxanes. The polyalkyl(hydro)cyclosiloxanes are commercially available and can be used as a mixture of cyclic species or can be purified by distillation prior to the hydrosilation reaction. Hydrosilation is achieved using well-known catalysts such as, for example, platinum, and the like.

By appropriate combination of cyclic siloxane and functionalized alkenes and/or alkynes, the compounds described herein can be tailored to address the particular needs of the microelectronic packaging industry. Important properties for resins used in the microelectronic packaging industry include, for example, crosslink density, hydrophobicity, glass transition temperature ($T_g$), coefficient of thermal expansion (CTE), and the like.

As used herein, the term "functionalized cyclic siloxane" refers to a compound having a siloxane ring, as well as a polymerizable moiety. In some embodiments of the invention, the term "polymerizable moiety" refers to a moiety having at least one unit of unsaturation that is capable of participating in a polymerization reaction. Typically, the unit of unsaturation is a carbon-carbon double bond. In other embodiments of the invention, the term "polymerizable moiety" refers to a ring-opening moiety, such as, for example, epoxy, oxetane, oxazoline, benzoxazine, and the like. In other embodiments, the term "polymerizable moiety" refers to a moiety that forms a ring upon polymerization, such as, for example, cyanate esters, propargyl ethers, and the like.

As used herein, "aliphatic" refers to any alkyl, alkenyl, cycloalkyl, or cycloalkenyl moiety.

As used herein, "alkyl" refers to straight or branched chain hydrocarbyl groups having from 1 up to about 100 carbon atoms. Whenever it appears herein, a numerical range, such as "1 to 100" or "$C_1$-$C_{100}$", refers to each integer in the given range; e.g., "$C_1$-$C_{100}$ alkyl" means that an alkyl group may comprise only 1 carbon atom, 2 carbon atoms, 3 carbon atoms, etc., up to and including 100 carbon atoms, although the term "alkyl" also includes instances where no numerical range of carbon atoms is designated). "Substituted alkyl" refers to alkyl moieties bearing substituents including alkyl, alkenyl, alkynyl, hydroxy, oxo, alkoxy, mercapto, cycloalkyl, substituted cycloalkyl, heterocyclic, substituted heterocyclic, aryl, substituted aryl, heteroaryl, substituted heteroaryl, aryloxy, substituted aryloxy, halogen, haloalkyl, cyano, nitro, nitrone, amino, amido, —C(O)H, —C(O)—, —S—, —S(O)$_2$—, —OC(O)—O—, —NR—C(O)—, —NR—C(O)—NR—, —OC(O)—NR—, wherein R is H or lower alkyl, acyl, oxyacyl, carboxyl, carbamate, sulfonyl, sulfonamide, sulfuryl, and the like.

As used herein, "cycloalkyl" refers to cyclic ring-containing groups typically containing in the range of about 3 up to about 8 carbon atoms, and "substituted cycloalkyl" refers to cycloalkyl groups further bearing one or more substituents as set forth above.

As used herein, "aryl" refers to aromatic groups having in the range of 6 up to 14 carbon atoms and "substituted aryl" refers to aryl groups further bearing one or more substituents as set forth above.

As used herein, "heterocyclic" refers to cyclic (i.e., ring-containing) groups containing one or more heteroatoms (e.g., N, O, S, or the like) as part of the ring structure, and having in the range of 3 up to 14 carbon atoms and "substituted heterocyclic" refers to heterocyclic groups further bearing one or more substituents as set forth above. The term heterocyclic is also intended to refer to heteroaromatic moieties. As used herein, "alkenyl" refers to straight or branched chain hydrocarbyl groups having at least one carbon-carbon double bond, and having in the range of about 2 up to about 100 carbon atoms, and "substituted alkenyl" refers to alkenyl groups further bearing one or more substituents as set forth above.

As used herein, "alkylene" refers to a divalent alkyl moiety, and "oxyalkylene" refers to an alkylene moiety containing at least one oxygen atom instead of a methylene (CH$_2$) unit. "Substituted alkylene" and "substituted oxyalkylene" refer to alkylene and oxyalkylene groups further bearing one or more substituents as set forth above.

As used herein, "arylene" refers to a divalent aryl moiety. "Substituted arylene" refers to arylene moieties bearing one or more substituents as set forth above.

As used herein, the term "acrylate" refers to a compound bearing at least one moiety having the structure:

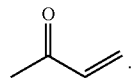

As used herein, the term "methacrylate" refers to a compound bearing at least one moiety having the structure:

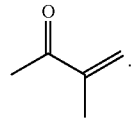

As used herein, the term "maleimide" refers to a compound bearing at least one moiety having the structure:

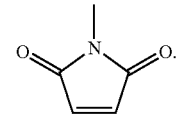

As used herein, the term "epoxy" refers to a compound bearing at least one moiety having the structure:

As used herein, the term "vinyl ether" refers to a compound bearing at least one moiety having the structure:

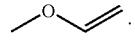

As used herein, the term "acrylamide" refers to a compound bearing at least one moiety having the structure:

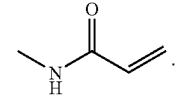

As used herein, the term "methacrylamide" refers to a compound bearing at least one moiety having the structure:

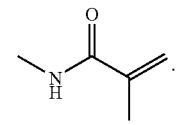

In one embodiment of the invention, there are provided compounds having the structure:

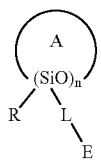

wherein:
A is a siloxane ring,
R is $C_1$ to about $C_{20}$ alkyl,
each L is independently a substituted or unsubstituted alkylene, substituted or unsubstituted oxyalkylene, or covalent bond,
at least one E is a polymerizable moiety, and
n is 3 to about 6.

In some embodiments, R is $C_1$ to about $C_{10}$ alkyl. In other embodiments, R is $C_1$ to about $C_5$ alkyl. In still other embodiments, R is $C_1$ to about $C_3$ alkyl. In some embodiments, R is methyl.

A wide variety of linkers L are contemplated for use in the practice of the invention. Indeed, any moiety that can be used to link the polymerizable moiety to the siloxane ring is contemplated for use in the practice of the invention. In some embodiments, L is a direct bond, linking the polymerizable moiety to the siloxane ring. In some embodiments, L is a $C_1$ to about $C_{20}$ substituted or unsubstituted alkylene or oxyalkylene. In other embodiments, L is a $C_1$ to about $C_{10}$ substituted or unsubstituted alkylene or oxyalkylene.

The linker L may optionally bear a wide variety of substituents, including, but not limited to, alkyl, alkenyl, alkynyl, hydroxy, oxo, alkoxy, mercapto, cycloalkyl, substituted cycloalkyl, heterocyclic, substituted heterocyclic, aryl, substituted aryl, heteroaryl, substituted heteroaryl, aryloxy, substituted aryloxy, halogen, haloalkyl, cyano, nitro, nitrone, amino, amido, —C(O)H, —C(O)—, —S—, —S(O)$_2$—, —OC(O)—O—, —NR—C(O)—, —NR—C(O)—NR—, —OC(O)—NR—, wherein R is H or lower alkyl, acyl, oxyacyl, carboxyl, carbamate, sulfonyl, sulfonamide, sulfuryl, and the like.

The polymerizable moiety E can be chosen from a wide variety of reactive groups. Indeed, the selection of E will depend on the type of thermosetting chemistry desired in the ultimate adhesive. For example, for an adhesive composition that is to be cured by a free-radical mechanism, a typical selection for E is acrylate, methacrylate, cyanoacrylate, maleimide, acrylamide, and the like. In other embodiments, E is selected from epoxies, imides, cyanate esters, vinyl ethers, vinyl esters, olefins, cyclic olefins (such as norbornenyl, and the like) siloxanes, styrenics, oxazolines, benzoxazines, oxetanes, and the like, or combinations thereof. It is understood that the polymerizable moieties set forth above as the component E are exemplary only, and in no way limit the scope of the invention. In addition, it is understood that E is not always a polymerizable moiety. Indeed, E can be a moiety that is used to manipulate hydrophobicity or crosslink density of the final resin. As such, other moieties contemplated as component E include, alkyl, fluoroalkyl, perfluoroalkyl, and the like. A variety of curing mechanisms will be known to the skilled artisan, including, but not limited to free radical, ring-opening, ring-closing, ene reactions, and the like.

In some embodiments of the invention, each E is independently a free-radical polymerizable moiety, a ring-opening polymerizable moiety, or a ring-closing polymerizable moiety. In certain embodiments, each E is independently a free-radical polymerizable moiety such as, for example, acrylate, methacrylate, maleimide, acrylamide, methacrylamide, styrenic, vinyl ester, olefin, cyclic olefin (such as norbornyl, and the like), allyl, vinyl ether, itaconate, fumarate, and the like.

In other embodiments, each E is independently a ring-opening polymerizable moiety such as, for example, epoxy, oxetane, oxazoline, benzoxazine, and the like.

In some embodiments, each E is independently a ring-closing polymerizable moiety such as, for example, cyanate ester, propargyl ether, and the like.

The functionalized cyclosiloxanes described herein are readily prepared by hydrosilating an appropriately functionalized alkene and/or alkyne with a either a mixture of polyalkyl(hydro)cyclosiloxanes or a purified polyalkyl(hydro)cyclosiloxane. An exemplary synthesis is outlined in Scheme 1.

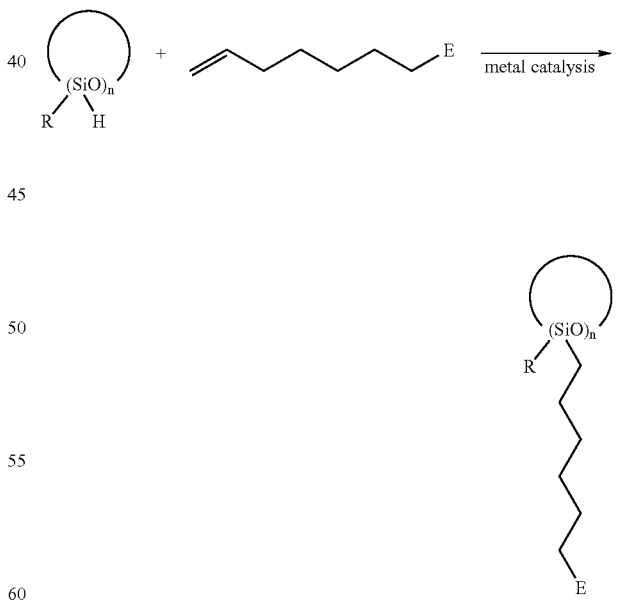

As set forth above, a wide variety of polymerizable moieties can be incorporated into the cyclic siloxane compounds of the invention. Some exemplary invention compounds include, but are not limited to, compounds having the structures set forth below:

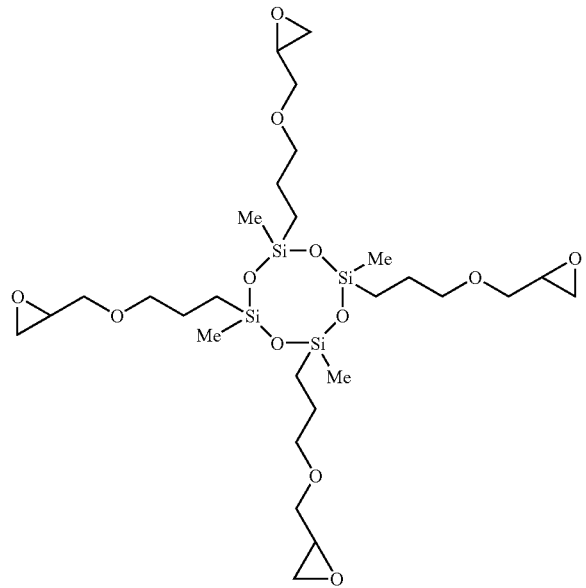
Compound 1
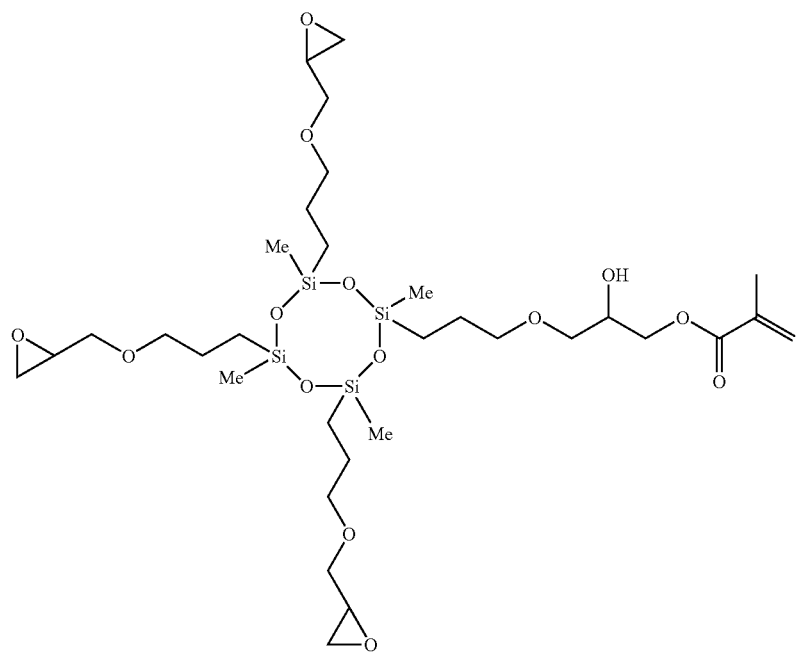
Compound 2

-continued
Compound 3
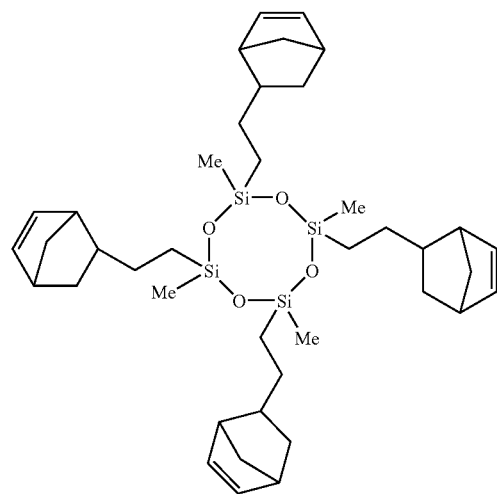
Compound 4
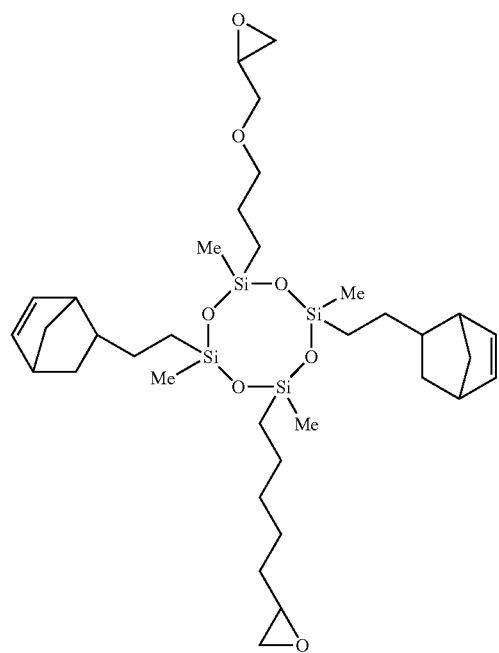
Compound 5
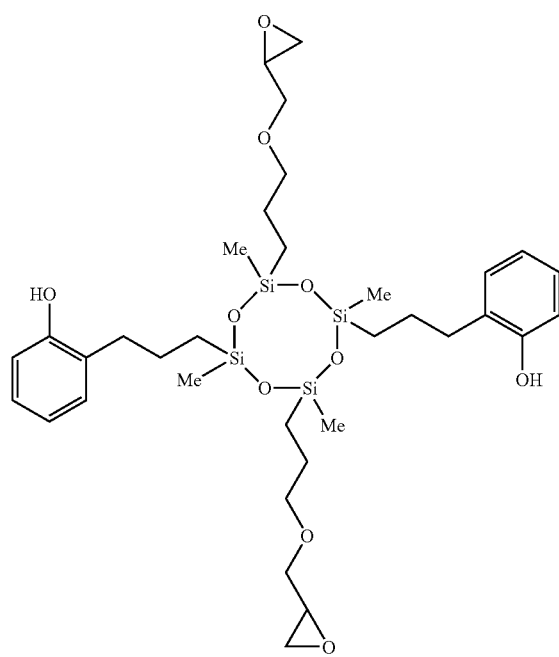
Compound 6
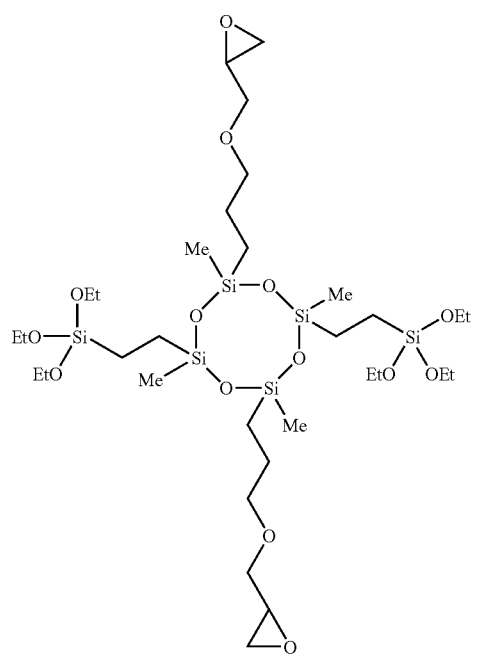

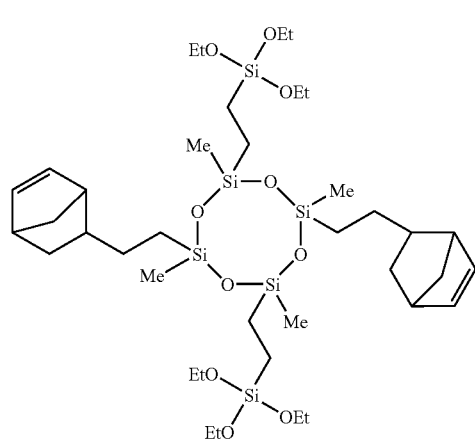
Compound 7
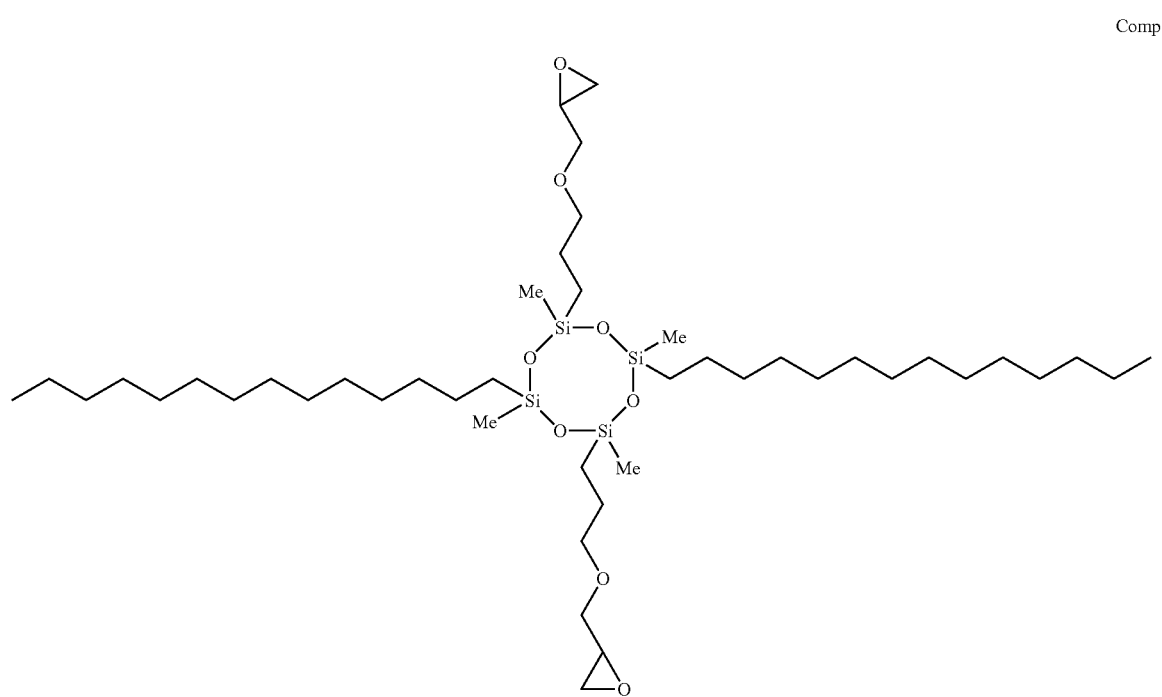
Compound 8

Compound 10
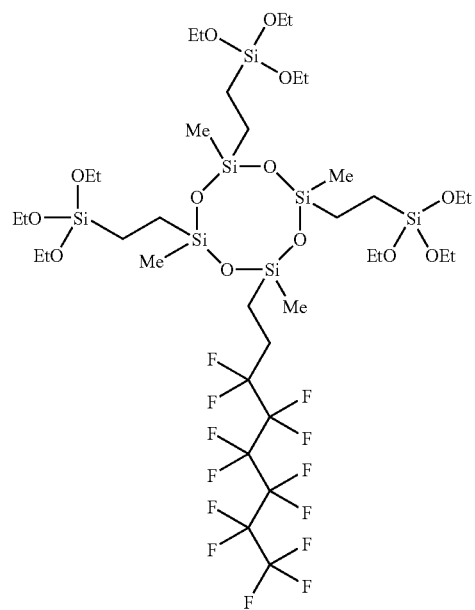
Compound 11
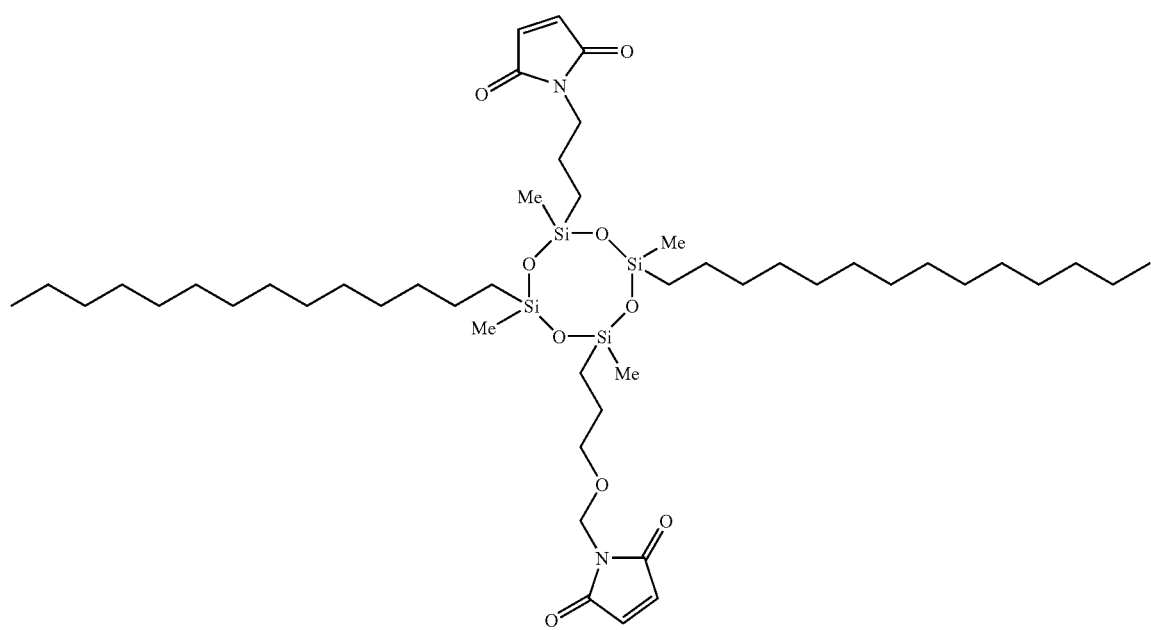

Compound 12
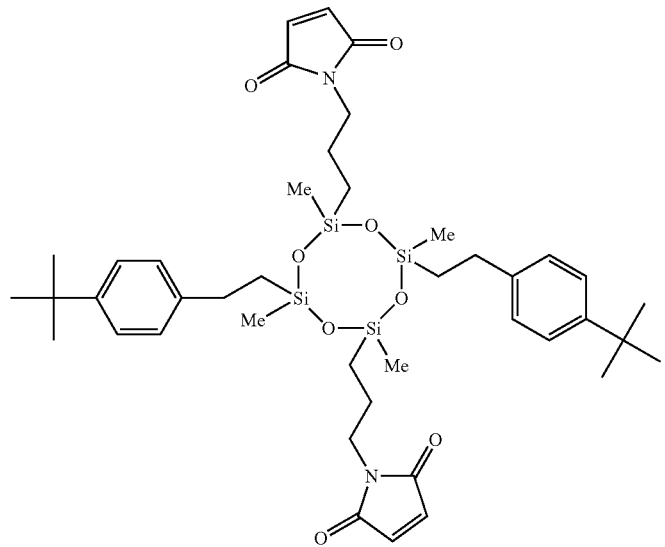
Compound 13
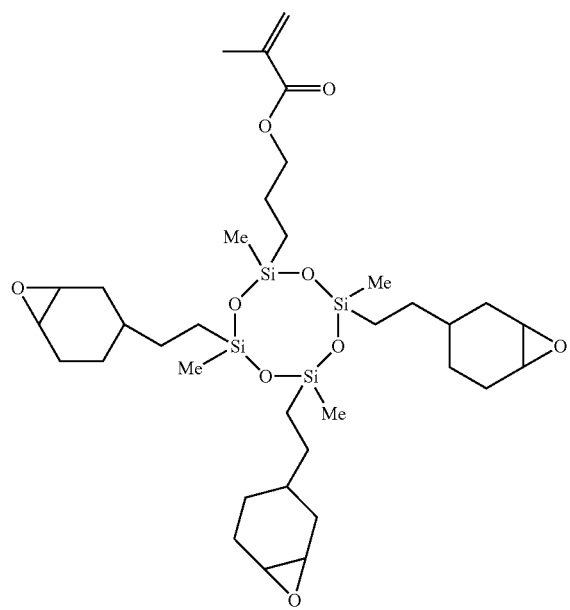

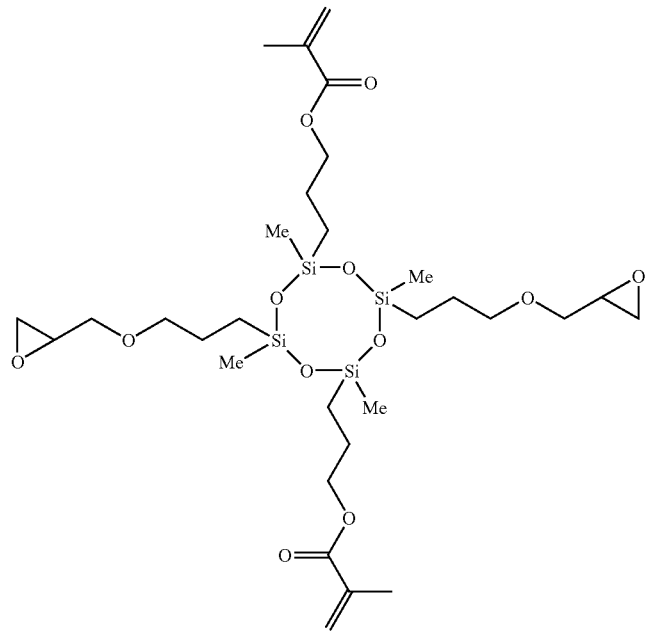
Compound 14
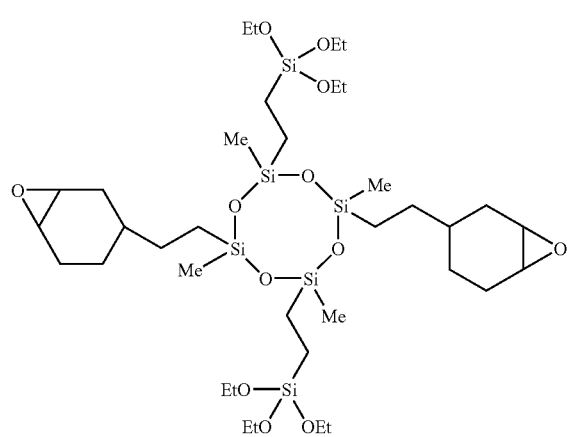
Compound 15

In addition to the examples set forth above, if an appropriate alkene is chosen, it is possible to prepare bridged compounds, one example of which is set forth below: present invention are compounds which decompose (i.e., have a half life in the range of about 10 hours) at temperatures in the range of about 70° C. up to about 180° C. Exemplary Compound 9

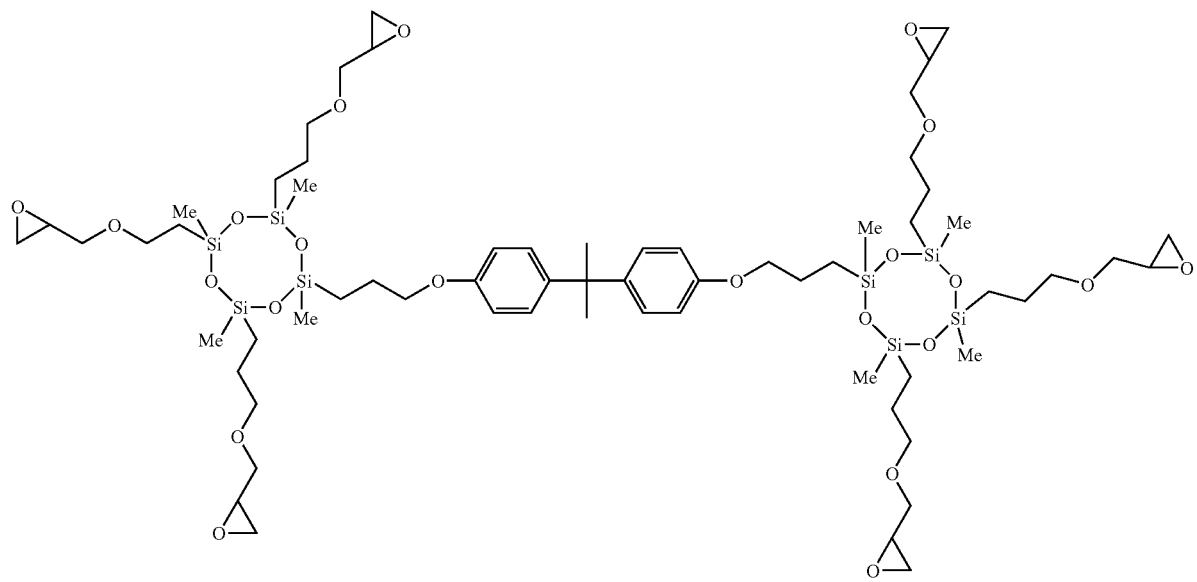

Indeed, compounds containing 2 or more alkene and/or alkyne units can be hydrosilated to produce dimers, trimers, and other oligomeric functionalized polycyclic siloxanes. Dendrimeric functionalized polyycyclic siloxanes are also contemplated for use in the practice of the invention.

In a further embodiment of the invention, there are provided adhesive compositions including a functionalized polycyclic siloxane compound of the invention and at least one curing initiator. In some embodiments, the functionalized polycyclic siloxane compound is present in the composition from about about 2 weight percent to about 98 weight percent (wt %) based on total weight of the composition. In other embodiments, there is at least additional compound that can co-cure with the functionalized polycyclic siloxane. The additional compound is typically present in the composition from about 10 wt % to about 90 wt % based on total weight of the composition. Such additional compounds include, for example, epoxies (such as phenolics, novalacs (both phenolic and cresolic) and the like), imides, monomaleimides, bismaleimides, polymaleimides, cyanate esters, vinyl ethers, vinyl esters, vinyl acetates, esters, ureas, amides, olefins (such as ethylenes, propylenes, and the like) siloxanes, cyanoacrylates, styrenes, oxazolines, benzoxazines, oxetanes, and the like, or combinations thereof.

The at least one curing initiator is typically present in the composition from about 0.1 wt % to about 5 wt % based on total weight of the composition. In some embodiments, the curing initiator is a free-radical initiator. As used herein, the term "free radical initiator" refers to any chemical species which, upon exposure to sufficient energy (e.g., light, heat, or the like), decomposes into two parts which are uncharged, but which each possess at least one unpaired electron. Free radical initiators contemplated for use in the practice of the free radical initiators contemplated for use in the practice of the present invention include peroxides (e.g., dicumyl peroxide, dibenzoyl peroxide, 2-butanone peroxide, tert-butyl perbenzoate, di-tert-butyl peroxide, 2,5-bis(tert-butylperoxy)-2,5-dimethylhexane, bis(tert-butyl peroxyisopropyl)benzene, and tert-butyl hydroperoxide), azo compounds (e.g., 2,2'-azobis(2-methyl-propanenitrile), 2,2'-azobis(2-methylbutanenitrile), and 1,1'-azobis(cyclohexanecarbonitrile)), and the like.

The term "free radical initiator" also includes photoinitiators. For example, for invention adhesive compositions that contain a photoinitiator, the curing process can be initiated by UV radiation. In one embodiment, the photoinitiator is present at a concentration of 0.1 wt % to 5 wt % based on the total weight of the organic compounds in the composition (excluding any filler). In a one embodiment, the photoinitiator comprises 0.1 wt % to 3.0 wt %, based on the total weight of the organic compounds in the composition. Photoinitiators include benzoin derivatives, benzilketals, α,α-dialkoxyacetophenones, α-hydroxyalkylphenones, α-aminoalkylphenones, acylphosphine oxides, titanocene compounds, combinations of benzophenones and amines or Michler's ketone, and the like.

In a further embodiment, there are provided die-attach pastes comprising:

a) about 2 weight percent to about 98 weight percent (wt %) of at least one invention functionalized polycyclic siloxane compound, based on total weight of the composition;

b) 0 wt % to about 90 wt % of a filler;

c) about 0.1 wt % to about 5 wt % of at least one curing initiator, based on total weight of the composition; and d) about 0.1 wt % to about 4 wt %, of at least one coupling agent, based on total weight of the composition.

The die-attach pastes described herein may further comprise additional compounds that can co-cure with the functionalized polycyclic siloxane. Such compounds include, for example, epoxies (such as phenolics, novalacs (both phenolic and cresolic) and the like), imides, monomaleimides, bismaleimides, polymaleimides, cyanate esters, vinyl ethers, vinyl esters, vinyl acetates, esters, ureas, amides, olefins (such as ethylenes, propylenes, and the like) siloxanes, cyanoacrylates, styrenes, oxazolines, benzoxazines, oxetanes, and the like, or combinations thereof.

Fillers contemplated for use in the practice of the present invention can be electrically conductive and/or thermally conductive. In addition, the fillers may act to modify the rheology of the resulting composition or die-attach paste. Examples of suitable electrically conductive fillers which can be employed in the practice of the present invention include silver, nickel, copper, aluminum, palladium, gold, graphite, metal-coated graphite (e.g., nickel-coated graphite, copper-coated graphite, and the like), and the like. Examples of suitable thermally conductive fillers which can be employed in the practice of the present invention include graphite, aluminum nitride, silicon carbide, boron nitride, diamond dust, alumina, and the like. Compounds that act primarily to modify rheology include polysiloxanes (such as polydimethyl siloxanes) silica, fumed silica, alumina, titania, and the like.

As used herein, the term "coupling agent" refers to chemical species that are capable of bonding to a mineral surface and which also contain polymerizably reactive functional group(s) so as to enable interaction with the adhesive composition and/or die-attach paste. Coupling agents thus facilitate linkage of the die-attach paste to the substrate to which it is applied.

Exemplary coupling agents contemplated for use in the practice of the present invention include silicate esters, metal acrylate salts (e.g., aluminum methacrylate), titanates (e.g., titanium methacryloxyethylacetoacetate triisopropoxide), or compounds that contain a copolymerizable group and a chelating ligand (e.g., phosphine, mercaptan, acetoacetate, and the like). In some embodiments, the coupling agents contain both a co-polymerizable function (e.g., vinyl moiety, acrylate moiety, methacrylate moiety, and the like), as well as a silicate ester function. The silicate ester portion of the coupling agent is capable of condensing with metal hydroxides present on the mineral surface of substrate, while the co-polymerizable function is capable of co-polymerizing with the other reactive components of invention die-attach paste. In certain embodiments coupling agents contemplated for use in the practice of the invention are oligomeric silicate coupling agents such as poly(methoxyvinylsiloxane).

In some embodiments, both photoinitiation and thermal initiation may be desirable. For example, curing of a photoinitiator-containing adhesive can be started by UV irradiation, and in a later processing step, curing can be completed by the application of heat to accomplish a free-radical cure. Both UV and thermal initiators may therefore be added to the adhesive composition.

In general, the adhesive compositions and/or die-attach pastes will cure within a temperature range of 80-220° C., and curing will be effected within a length of time of less than 1 minute to 60 minutes. As will be understood by those skilled in the art, the time and temperature curing profile for each adhesive composition will vary, and different compositions can be designed to provide the curing profile that will be suited to the particular industrial manufacturing process.

In certain embodiments, the adhesive compositions and/or die-attach pastes may contain compounds that lend additional flexibility and toughness to the resultant cured adhesive. Such compounds may be any thermoset or thermoplastic material having a Tg of 50° C. or less, and typically will be a polymeric material characterized by free rotation about the chemical bonds, the presence of ether groups, and the absence of ring structures. Suitable such modifiers include polyacrylates, poly(butadiene), polyTHF (polymerized tetrahydrofuran, also known as poly(1,4-butanediol)), CTBN (carboxy-terminated butadiene-acrylonitrile) rubber, and polypropylene glycol. When present, toughening compounds may be in an amount up to about 15 percent by weight of the maleimide and other monofunctional vinyl compound.

Inhibitors for free-radical cure may also be added to the adhesive compositions and die-attach pastes described herein to extend the useful shelf life of compositions containing the functionalized polycyclic siloxane compounds described herein. Examples of these inhibitors include hindered phenols such as 2,6-di-tert-butyl-4-methylphenol; 2,6-di-tert-butyl-4-methoxyphenol; tert-butyl hydroquinone; tetrakis(methylene(3,5-di-tert-butyl-4-hydroxyhydrocinnamate)) benzene; 2,2'-methylenebis(6-tert-butyl-p-cresol); and 1,3,5-trimethyl-2,4,6-tris(3',5'-di-tert-butyl-4-hydroxybenzyl) benzene. Other useful hydrogen-donating antioxidants include derivatives of p-phenylenediamine and diphenylamine. It is also well know in the art that hydrogen-donating antioxidants may be synergistically combined with quinones, and metal deactivators to make a very efficient inhibitor package. Examples of suitable quinones include benzoquinone, 2-tert butyl-1,4-benzoquinone; 2-phenyl-1,4-benzoquinone; naphthoquinone, and 2,5-dichloro-1,4-benzoquinone. Examples of metal deactivators include N,N'-bis(3,5-di-tert-butyl-4-hydroxyhydrocinnamoyl)hydrazine; oxalyl bis(benzylidenehydrazide); and N-phenyl-N'-(4-toluenesulfonyl)-p-phenylenediamine. Nitroxyl radical compounds such as TEMPO (2,2,6,6-tetramethyl-1-piperidnyloxy, free radical) are also effective as inhibitors at low concentrations. The total amount of antioxidant plus synergists typically falls in the range of 100 to 2000 ppm relative to the weight of total base resin. Other additives, such as adhesion promoters, in types and amounts known in the art, may also be added.

The adhesive compositions and die-attach pastes described herein will perform within the commercially acceptable range for die-attach adhesives. Commerically acceptable values for die shear for the adhesives on a 80×80 $mil^2$ silicon die are in the range of greater than or equal to 1 kg at room temperature, and greater than or equal to 0.5 kg at 240° C. Acceptable values for warpage for a 500×500 $mil^2$ die are in the range of less than or equal to 70 Nm at room temperature.

In yet another embodiment of the invention, there are provided assemblies of components adhered together employing the above-described adhesive compositions and/or die-attach pastes. Thus, for example, assemblies comprising a first article adhered to a second article by a cured aliquot of the above-described adhesive composition are provided. Articles of the present invention can be any article of manufacture for which adhesion to another article is desired. Articles particularly contemplated for assembly employing invention compositions include electronic articles such as memory devices, ASIC devices, microprocessors, flash memory devices, and the like. Also contemplated are assemblies comprising a microelectronic device permanently adhered to a substrate by a cured aliquot of the above-described die-attach paste. Microelectronic devices contemplated for use with invention die-attach pastes include copper lead frames, Alloy 42 lead frames, silicon dice, gallium arsenide dice, germanium dice, and the like.

In other embodiments of the invention, there are provided methods for attaching a first article to a second article. Such methods can be performed, for example, by (a) applying an aliquot of an invention adhesive composition to the first article, (b) bringing the first and second article into contact to form an assembly wherein the first article and the second article are separated only by the adhesive composition applied in (a), and, (c) subjecting the assembly to conditions suitable to cure the adhesive composition.

In still further embodiments, there are provided methods for attaching a semiconductor die to a substrate. Such methods can be performed, for example, by (a) applying an invention die-attach paste to the substrate and/or the semiconductor die, (b) bringing the substrate and the die into contact to form an assembly wherein the substrate and the die are separated only by the die-attach paste applied in (a), and, (c) subjecting the assembly to conditions suitable to cure the die-attach paste.

Conditions suitable to cure invention die-attach pastes include subjecting the above-described assembly to a temperature of less than about 200° C. for about 0.5 up to about 2 minutes. This rapid, short duration heating can be accomplished in a variety of ways, e.g., with an in-line heated rail, a belt furnace, or the like, as will be well known to the skilled artisan. Optionally, the pastes can be oven cured at 150-220° C.

The invention will now be further described with reference to the following non-limiting examples.

EXAMPLES

Example 1

A 500-mL round bottomed flask with a Teflon-coated stir bar was charged with 30.0 g (500 mmol Si—H) of tetramethylcyclosiloxane along with toluene (200 g) and two crystals of chloroplatinic acid. The solution was warmed to around 50° C. A pressure equalized dropping funnel was fitted on to the flask. To the funnel was added allyl glycidyl ether (500 mmol, 57.0 g), which was added dropwise over 30 minutes to the stirred solution. The exothermic reaction started to subside after about one hour. The dropping funnel was replaced with a reflux condenser and the solution was refluxed for 2 hours to complete the hydrosilation. After cooling the solution was filtered through 20 g of silica gel to remove the catalyst and decolorize the solution. Removal of the solvent afforded about 80 g of a clear fluid material.

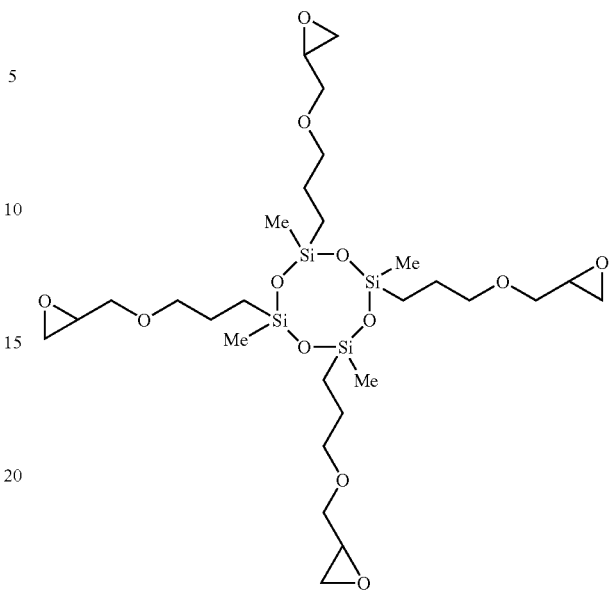

Example 2

80 g of the tetra-epoxy compound made in example 1 was charged into a 1-L 2-neck flask equipped with a Teflon-coated stir bar, a reflux condenser and a gas dispersion tube. Toluene (200 g) was added to the flask along with methacrylic acid (175 mmol, 15.0 g). To the flask was also added 500 ppm (0.05 g) of BHT and 0.1 g of dimethyl aminopyridine (DMAP). The solution was stirred at approximately 100°C. for 2 hours while a small amount of air was pumped into the solution to prevent polymerization of the product. The work-up of the product consisted of washing the solution in a separatory funnel with saturated $NaHCO_3$ solution to remove the excess methacrylic acid, drying over $MgSO_4$, followed by filtering over 20 g of silica gel. The removal of the solvent afforded 84 g of a clear low viscosity liquid.

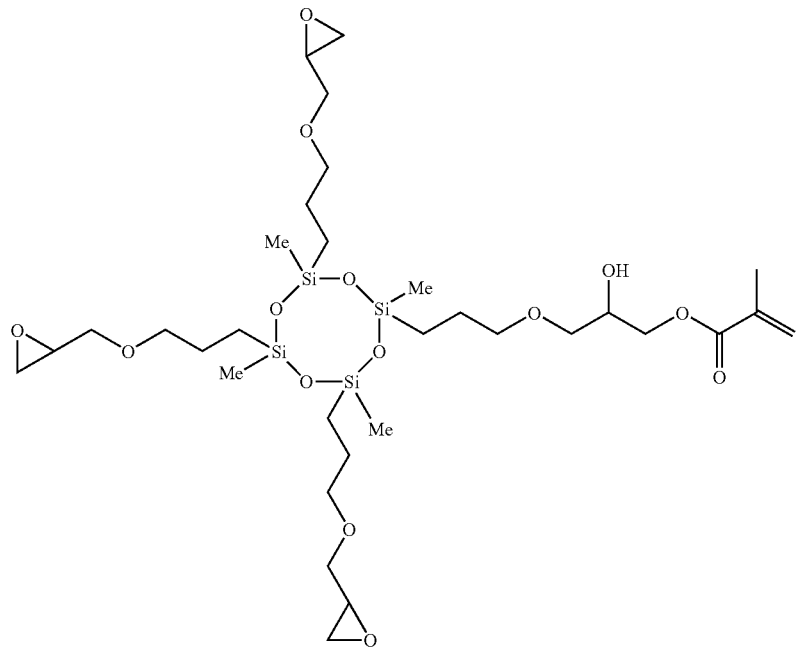

Example 3

A 500-mL round-bottomed flask with a Teflon-coated stir bar was charged with 20.0 g (333 mmol of Si—H) of tetramethylcyclosiloxane, along with 200 g of toluene and two crystals of chloroplatinic acid and 500 ppm (0.03 g) of BHT. The solution was heated slightly to about 50° C. To a pressure equalized dropping funnel was added 5-vinyl-2-norbornene (333 mmol, 40.0 g), which was added dropwise to the heated solution over 30 minutes. The exothermic reaction subsided after about one hour. The dropping funnel was replaced with a reflux condenser and the solution was refluxed for 2 hours to complete the hydrosilation. After cooling, the solution was filtered over 15 g of silica gel to decolorize the solution. Removal of the solvent afforded 55 g of a thick clear resin.

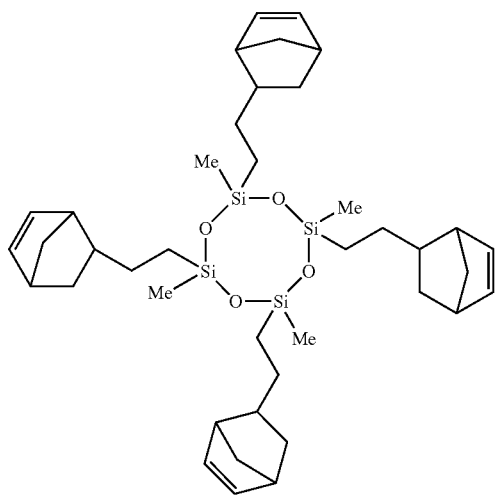

Example 4

A 500-mL round bottomed flask with a Teflon-coated stir bar was charged with 30.0 g (500 mmol Si—H) of tetramethylcyclosiloxane along with toluene (200 g), two crystals of chloroplatinic acid, and 500 ppm (0.05 g) of BHT. To a pressure equalized dropping funnel was added allyl glycidyl ether (250 mmol 28.5 g). The tetramethylcyclosiloxane solution was heated to around 50° C., while the allyl glycidyl ether was added dropwise over 30 minutes. As the allyl glycidyl ether is added a gradual exothermic reaction occurs indicative of hydrosilation. Once the entire reagent has been added the dropping funnel is charged with 5-vinyl-2-norbornene (250 mmol 30.0 g). This reagent is also slowly added over 30 minutes. After the addition is complete the dropping funnel is replaced with a reflux condenser and the solution is refluxed for 2 hours to complete the hydrosilation. After cooling the solution is filtered through 20 g of silica gel to remove the catalyst and to help decolorize the solution. After removal of the solvent using a rotary evaporator approximately 80 g of a thick viscous clear liquid was obtained.

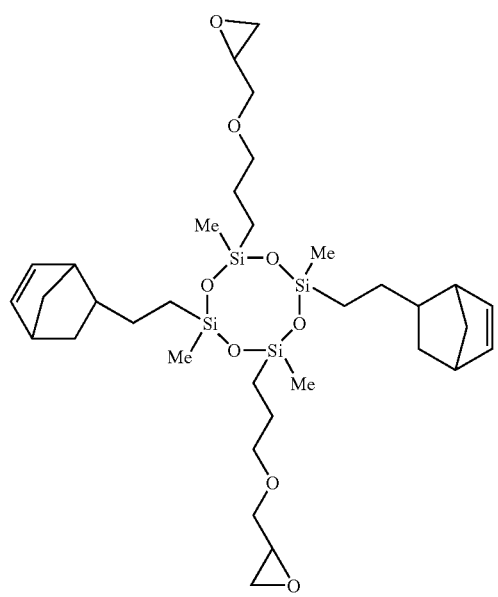

Example 5

A 500-mL round-bottomed flask equipped with a Teflon-coated stir bar and a pressure equalized dropping funnel was charged with 20.0 g (333 mmol of Si—H) of tetramethylcyclosiloxane. To the flask were also added toluene (150 g) and two crystals of chlroplatinic acid. To the dropping funnel was added allyl glycidyl ether (223 mmol, 25.4 g). The solution was heated to around 50° C., while the allyl glycidyl ether was added dropwise over 30 minutes. After the exotherm subsided, 2-allylphenol (110 mmol, 14.8 g) was added to the flask, and the dropping funnel was removed and replaced with a condenser. The solution was heated at about 70° C. overnight to complete the hydrosilation. After removal of the solvent 60 g of a brown fluid resin was obtained.

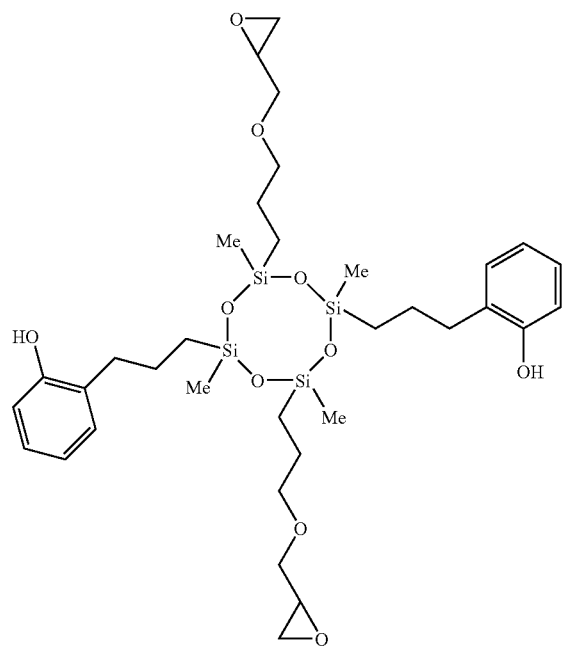

Example 6

A 500-mL round-bottomed flask equipped with a Teflon-coated stir bar and a pressure equalized dropping funnel was charged with 24.0 g (400 mmol of Si—H) of tetramethylcyclosiloxane. To the flask were also added toluene (200 g) and two crystals of chlroplatinic acid. To the dropping funnel was added allyl glycidyl ether (200 mmol, 22.8 g). The solution was heated to around 50° C., while the allyl glycidyl ether was added dropwise over 30 minutes. After the exotherm subsided, vinyl-triethoxysilane (200 mmol, 38.8 g) was added to the flask, the dropping funnel was removed and replaced with a condenser. The solution was heated to reflux for 3 hours to complete the hydrosilation. The solution was filtered through 15 g of silica gel after cooling; followed by removal of the solvent which afforded 78 g of a low viscosity clear liquid.

over 30 minutes. After the addition was complete the dropping funnel was charged with 5-vinyl-2-norbornene (200 mmol, 24.0 g), which was added dropwise to the solution over 30 minutes. The dropping funnel was replaced with a reflux condenser and the solution was refluxed for 2 hours to complete the reaction. The cooled solution was filtered through 10 g of silica gel to remove the color and catalyst. After removal of the solvent 80 g of a thin clear liquid was obtained.

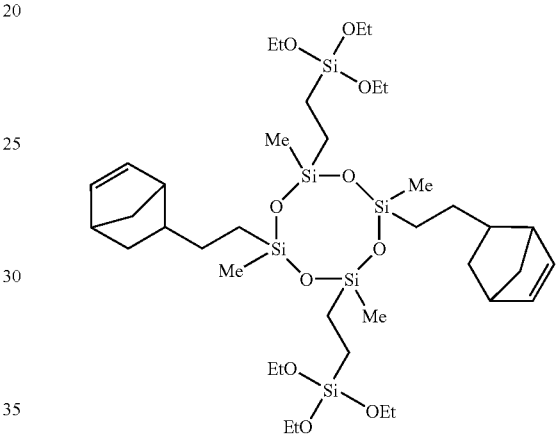

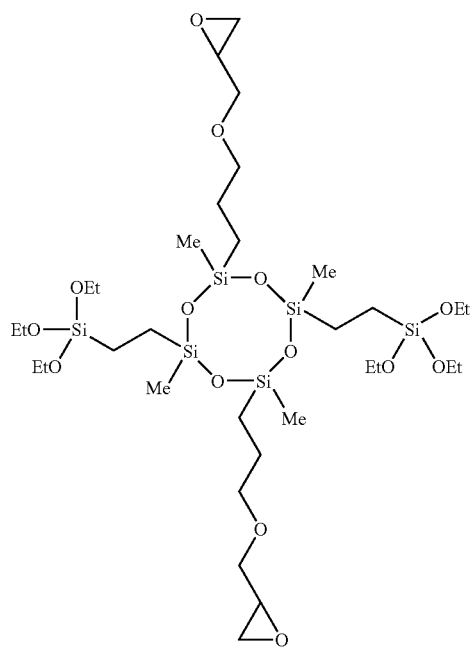

Example 7

A 500-mL round-bottomed flask equipped with a Teflon-coated stir bar and pressure equalized dropping funnel was charged with 24.0 g (400 mmol of Si—H) of tetramethylcyclosiloxane. To the flask was also added toluene (200 g), two crystals of chloroplatinic acid, and 500 ppm (0.04 g) of BHT. The solution was heated to 50° C., while vinyl-triethoxysilane (200 mmol, 38.0 g) was added dropwise to the solution

Example 8

A 500-mL round bottomed-flask equipped with a Teflon-coated stir bar and pressure equalized dropping funnel was charged with 24.0 g (400 mmol Si—H) of tetramethylcyclosiloxane. To the flask were also added toluene (200 g) and two crystals of chloroplatinic acid. The solution was heated to 50° C., while 1-tetradecene (200 mmol 39.2 g) was added dropwise to the reaction over 30 minutes. After the exotherm subsided the dropping funnel was charged with allyl glycidyl ether (200 mmol, 23.0 g), which was added dropwise the reaction over 30 minutes. The dropping funnel was replaced with a reflux condenser and the solution was refluxed for 2 hours to complete the hydrosilation. After cooling the solution was filtered through 20 g of silica gel. Removal of the solvent afforded 80 g of clear low viscosity liquid.

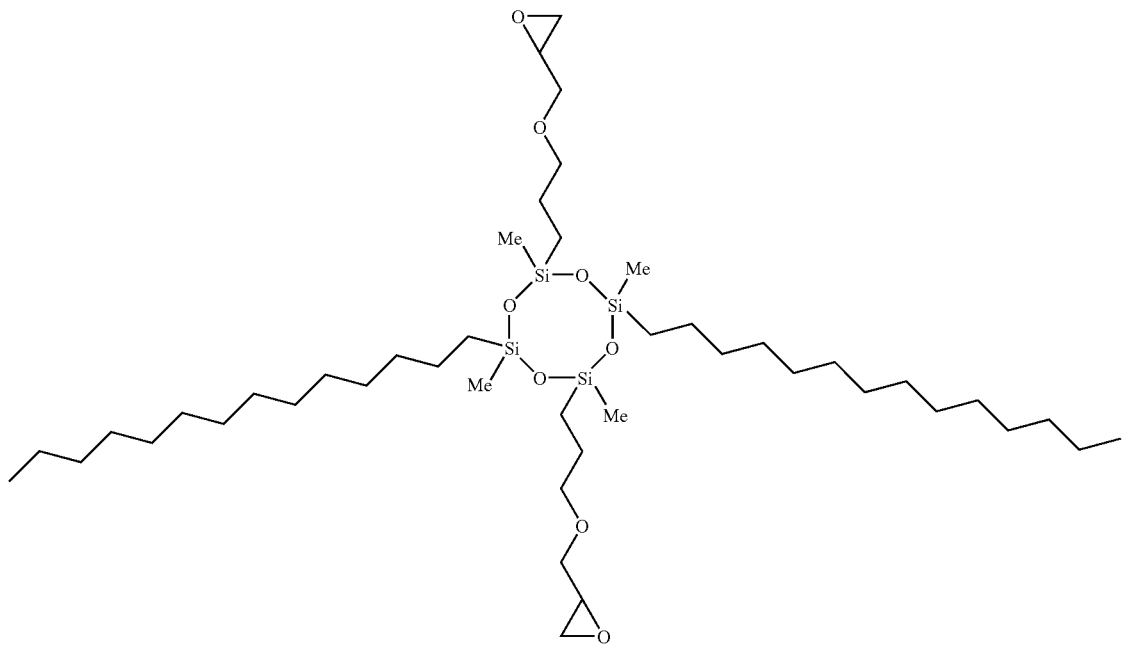

Example 9

A 500-mL round bottomed flask with a Teflon-coated stir bar was charged with 24.0 g (400 mmol Si—H) of tetramethylcyclosiloxane, along with toluene (150 g) and two crystals of chloroplatinic acid. To the flask was also added bisphenol-A diallyl ether (100 mmol, 15.4 g). The flask was warmed to about 50° C. where the exothermic hydrosilation reaction started to occur and the temperature rose to around 70° C. After the exothermic reaction subsided, a pressure equalized dropping funnel was added fitted on the flask. To the dropping funnel was added allyl glycidyl ether (300 mmol, 34.2 g), which was added dropwise over 30 minutes to the hot solution. After the addition was complete the dropping funnel was replaced with a reflux condenser and the solution was refluxed for 2 hours to complete the hydrosilation. After cooling, the solution was filtered through 20 g of silica gel to decolorize. Approximately 70 g of a clear fluid material was obtained after removal of the solvent.

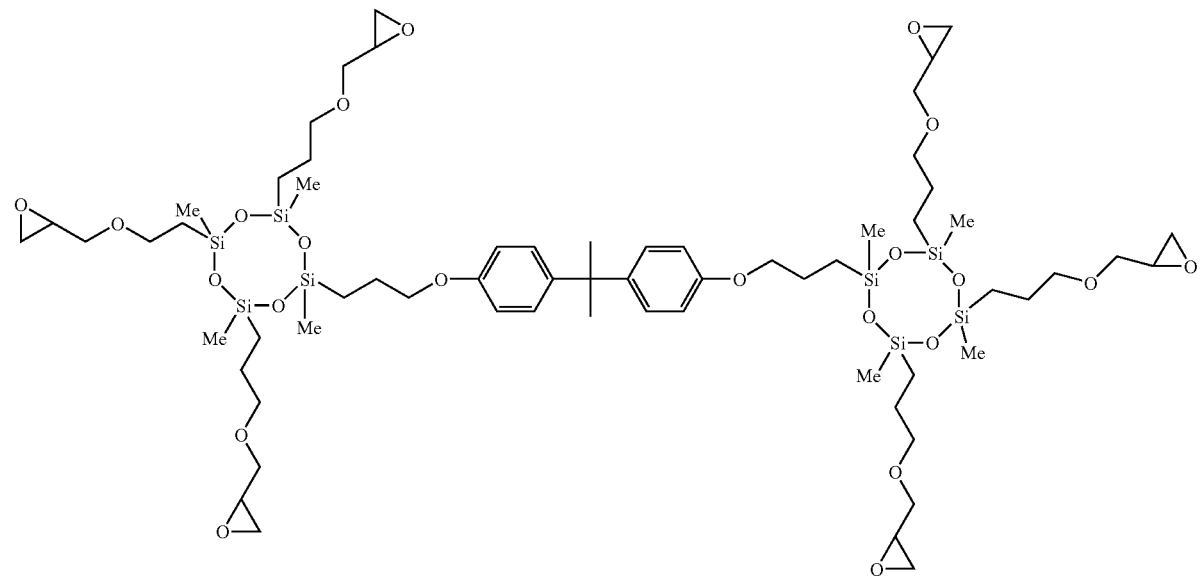

Example 10

A 500-mL round-bottomed flask equipped with a Teflon-coated stir bar and a pressure equalized dropping funnel was charged with 18.0 g (300 mmol Si—H) of tetramethylcyclosiloxane. To the flask was added toluene (200 g) of and two crystals of chloroplatinic acid. The solution was stirred and heated to 50° C., while vinyl-triethoxysilane (225 mmol, 43.7 g) was added over 30 minutes to the solution. The exothermic reaction subsided after an hour, then 1H,1H,2H-perfluoro-1-octene (75 mmol, 26.0 g) was added to the flask and the solution heated to reflux for one hour to complete the hydrosilation. After cooling to room temperature, the solution was filtered over 10 g of silica gel to decolorize, followed by removal of the solvent, which afforded 80 g of a thin clear liquid.

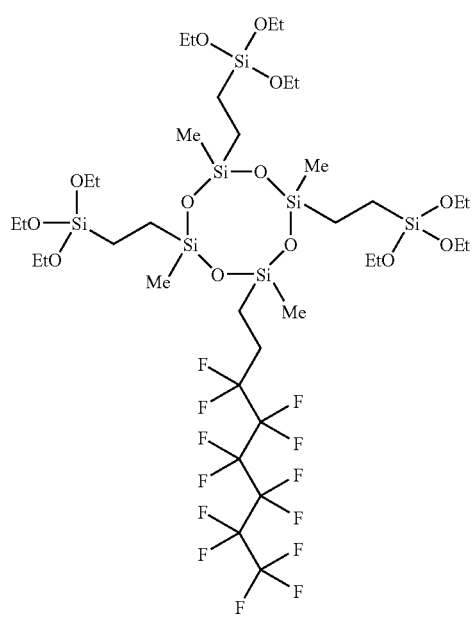

Example 11

A 500-mL round-bottomed flask equipped with a Teflon-coated stir bar and reflux condenser was charged with 24.0 g (400 mmol Si—H) of tetramethylcyclosiloxane, toluene (200 g), 1-tetradecene (200 mmol, 39.2 g), and two crystals of chloroplatinic acid. The solution was heated to 50° C., and the exothermic reaction started to consume the alkene. The solution was allowed to reflux for 3 hours to complete the reaction. The solution was allowed to cool to room temperature when allylamine (230 mmol, 13.0 g) was added to the flask along with two more crystals of chloroplatinic acid, followed by overnight reflux to complete the hydrosilation. The solution was then filtered through 20 g of silica gel to decolorize the intermediate. The removal of the solvent afforded 47 g of a thin liquid. The conversion to the maleimide was done by adding triethylamine (20 g), methanesulfonic acid (25 g), and toluene (150 g) to the intermediate in a 500 mL round bottomed flask equipped with a stir bar and a dean-stark trap with reflux condenser. To the stirred solution was added maleic anhydride (200 mmol, 19.6 g) of. The solution was refluxed overnight to convert to the maleimide, approximately 2 mL of water was collected. The product was separated form the salt layer, and filtered through 20 g of silica gel. After removal of the solvent 62 g of a thin yellow liquid was obtained.

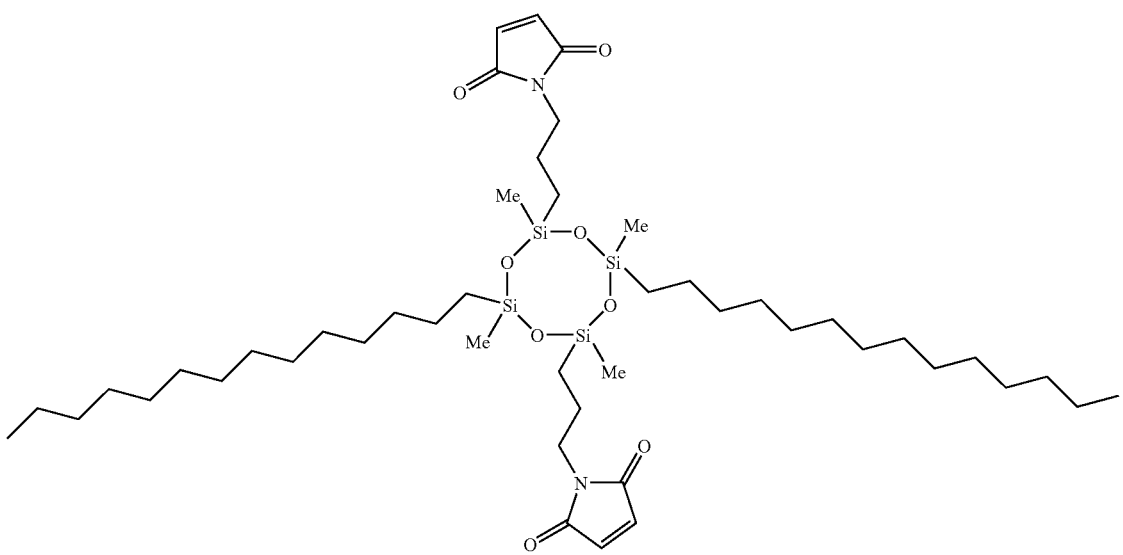

Example 12

A 500-mL round-bottomed flask equipped with a Teflon-coated stir bar and reflux condenser was charged with 24.0 g (400 mmol Si—H) of tetramethylcyclosiloxane, toluene (200 g, 200 mmol), t-butylstyrene (32.0 g), and two crystals of chloroplatinic acid. The solution was heated to 50° C., and the exothermic reaction started to consume the alkene. The solution was allowed to reflux for 3 hours to complete the reaction. The solution was allowed to cool to room temperature when allylamine (210 mmol, 12.0 g) was added to the flask along with two more crystals of chloroplatinic acid, followed by overnight reflux to complete the hydrosilation. The solution was then filtered through 10 g of silica gel to decolorize the intermediate. The removal of the solvent afforded 60 g of an orange liquid. The conversion to the maleimide was done by adding 20 g of triethylamine, 27 g of methanesulfonic acid along with a 150 g of toluene to the intermediate in a 500 mL round bottomed flask equipped with a stir bar and a dean-stark trap with reflux condenser. To the stirred solution was added 230 mmol (23.0 g) of maleic anhydride. The solution was refluxed overnight to convert to the maleimide, approximately 3 mL of water was collected. The product was separated form the salt layer, and filtered through 15 g of silica gel. After removal of the solvent 65 g of a dark viscous resin was obtained.

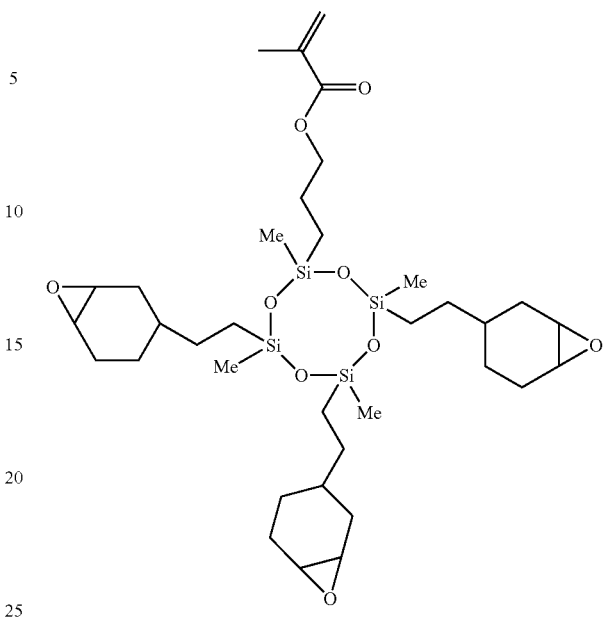

Example 14

A 500-mL round-bottomed flask equipped with a Teflon-coated stir bar and pressure equalized dropping funnel was charged with 24.0 g (400 mmol Si—H) of tetramethylcyclosiloxane, toluene (150 g), and two crystals of chloroplatinic acid. The solution was heated to 50° C., while allyl glycidyl ether (200 mmol, 22.8 g) was added dropwise to the solution over 30 minutes. After an hour, allylmethacrylate (200 mmol 25.2 g) and BHT (500 ppm) was added to the flask. A gas dispersion tube was inserted into the solution and air was admitted into the solution while heating for 3 hours at 100°C. to complete the hydrosilation. After cooling, the solution was filtered through 20 g of silica gel. The removal of the solvent under reduced pressure afforded 65 g of a thin yellow liquid.

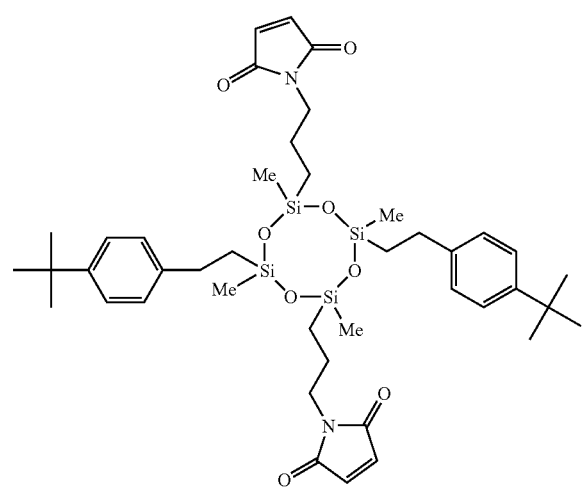

Example 13

A 500-mL round-bottomed flask equipped with a Teflon-coated stir bar and a reflux condenser was charged with 8.75 g (146 mmol Si—H) of tetramethylcyclosiloxane. To the flask were also added 4-vinyl-1-cyclohexene-1,2-epoxide (108 mmol, 13.4 g), toluene (100 g) and two crystals of chloroplatinic acid. The solution was stirred and refluxed for 3 hours to complete the hydrosilation. After cooling to room temperature, BHT (200 ppm) was added to the flask along with allylmethacrylate (38 mmol, 4.8 g). A gas dispersion tube was inserted into the flask and a small amount of air was bubbled into the stirred solution, while heating to 80° C. for 2 hours to complete the hydrosilation. The cooled solution was filtered through 10 g of silica gel, and after removal of the solvent 27 g of a viscous clear liquid was collected.

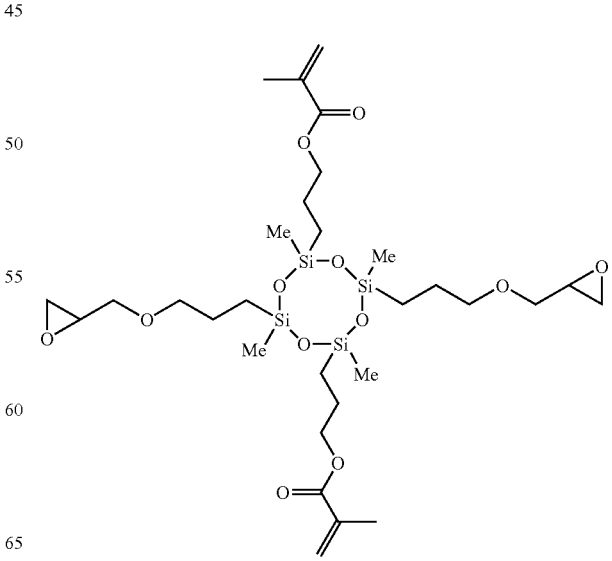

Example 15

A 500-mL round-bottomed flask equipped with a Teflon-coated stir bar and a reflux condenser was charged with 24.0 g (400 mmol Si—H) of tetramethylcyclosiloxane. To the flask was added 4-vinyl-1-cyclohexene-1,2-epoxide (200 mmol 24.8 g), toluene (200 g), and two crystals of chloroplatinic acid. The solution was stirred and refluxed for 3 hours to complete the hydrosilation. After cooling to room temperature, vinyl-triethoxysilane (200 mmol, 38.0 g) was added to the flask and the solution was refluxed again for an additional 3 hours to complete the hydrosilation. After cooling down to room temperature, the solution was filtered through 10 g of silica gel to decolorize; stripping off the solvent afforded 82 g of a thick clear resin.

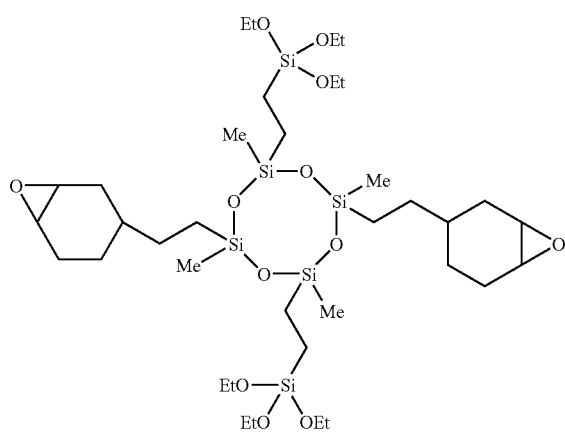

While this invention has been described with respect to these non-limiting examples, it should be clear that other modifications and variations are possible without departing from the spirit of the invention.

-continued
Compound 3
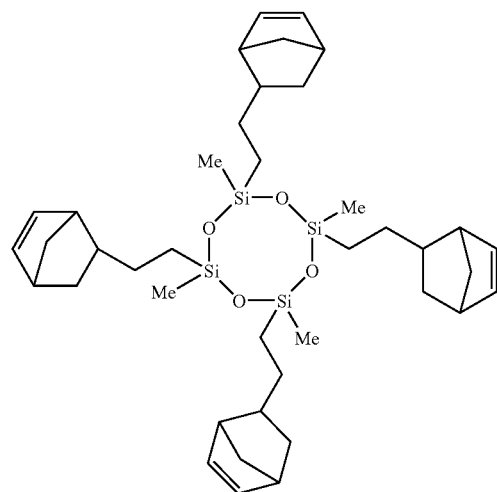
Compound 4
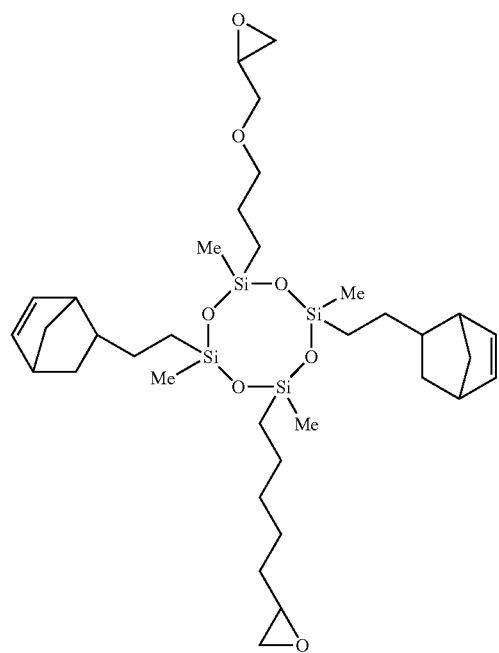
Compound 5
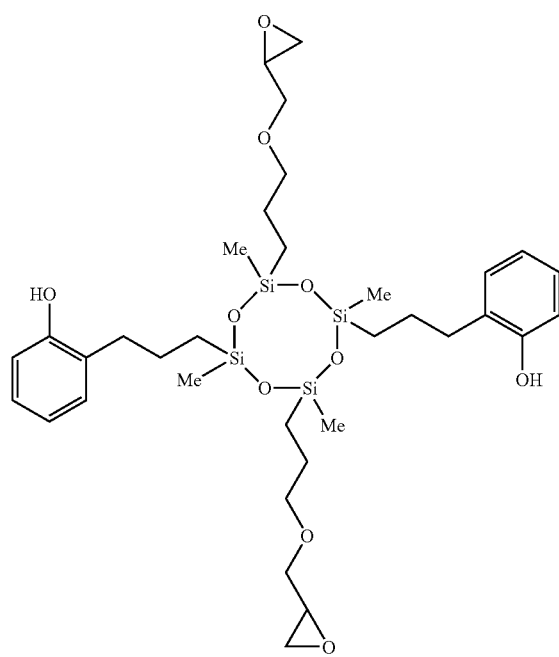
Compound 6
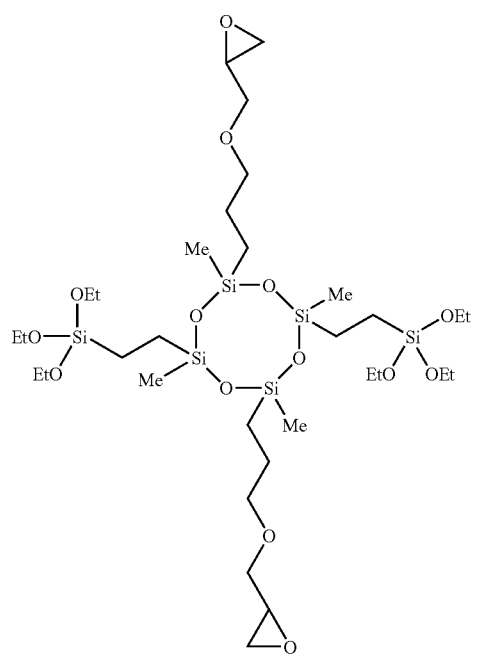

-continued
Compound 7
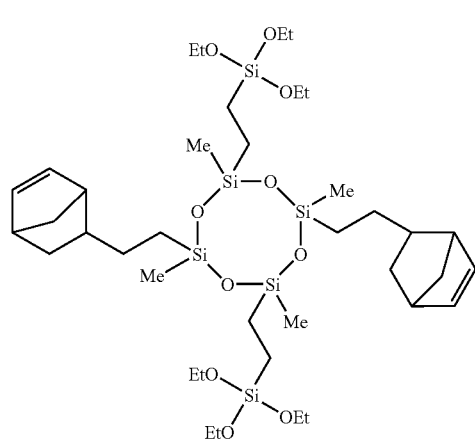
Compound 8
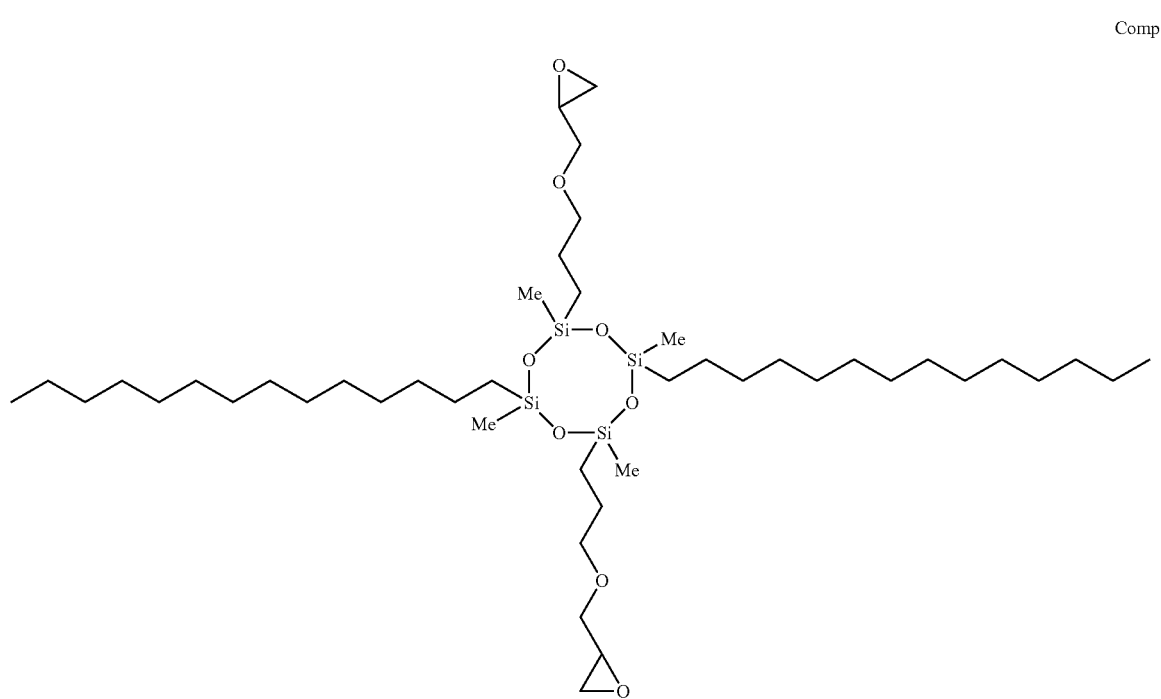

Compound 10
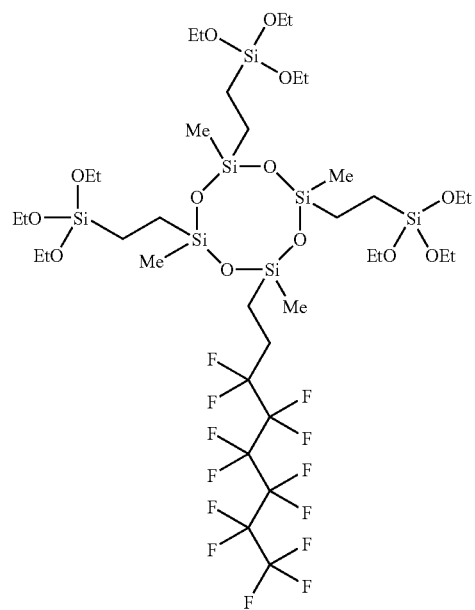
Compound 11
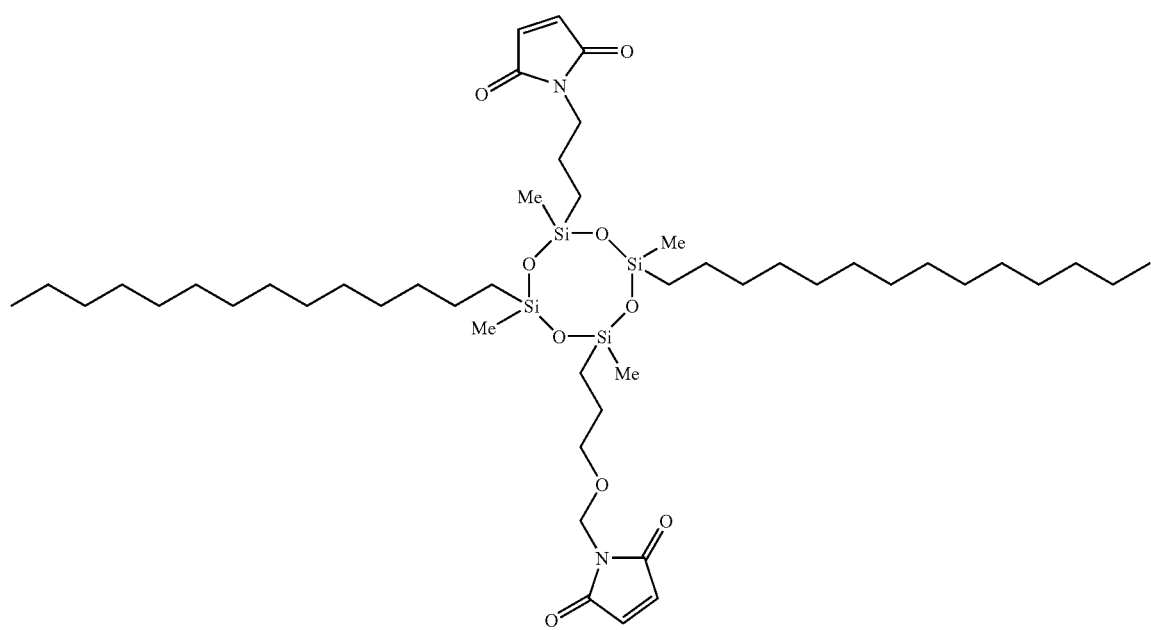

Compound 12
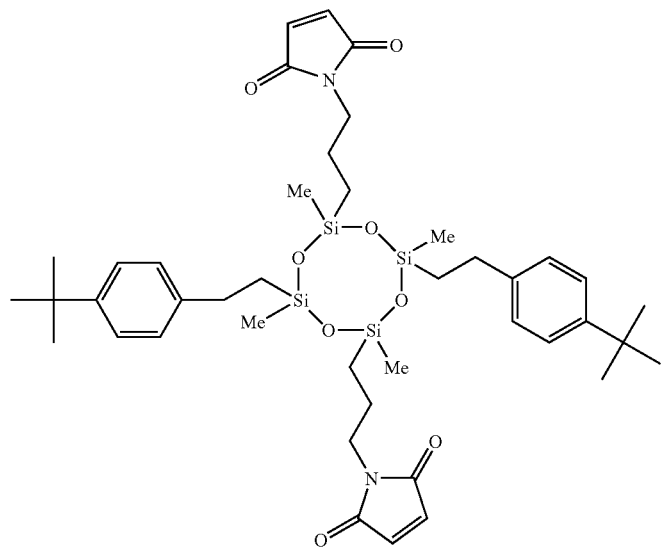
Compound 13
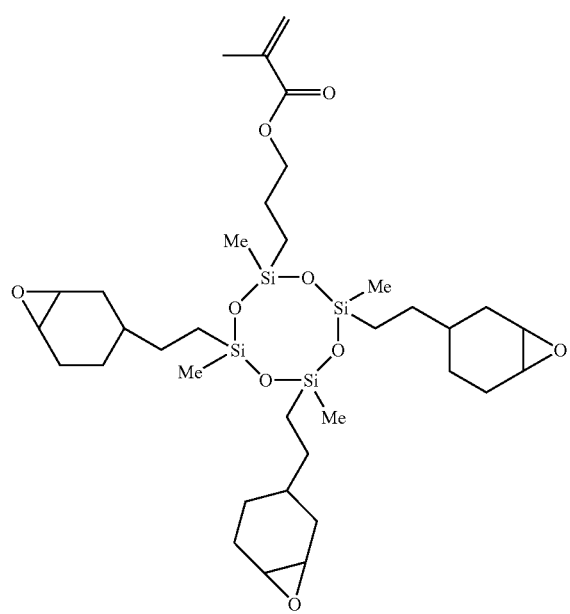

Compound 14
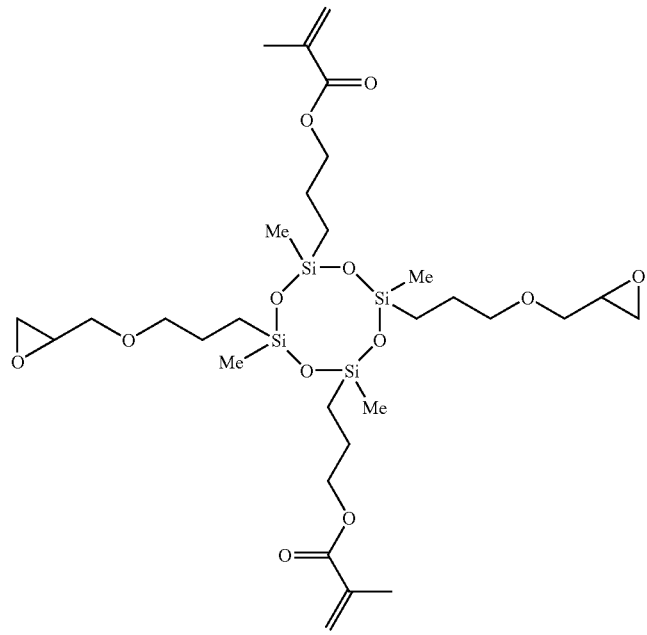
Compound 15
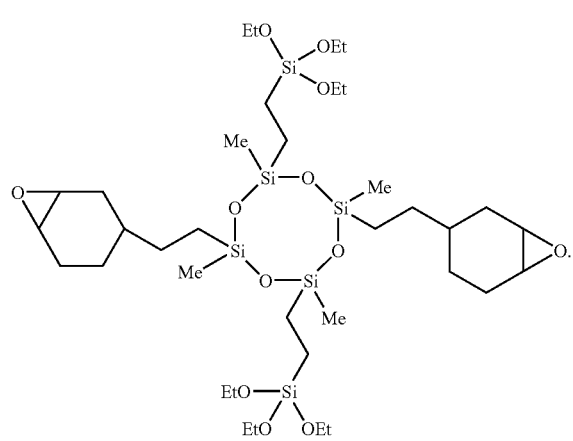

10. A compound having the structure:
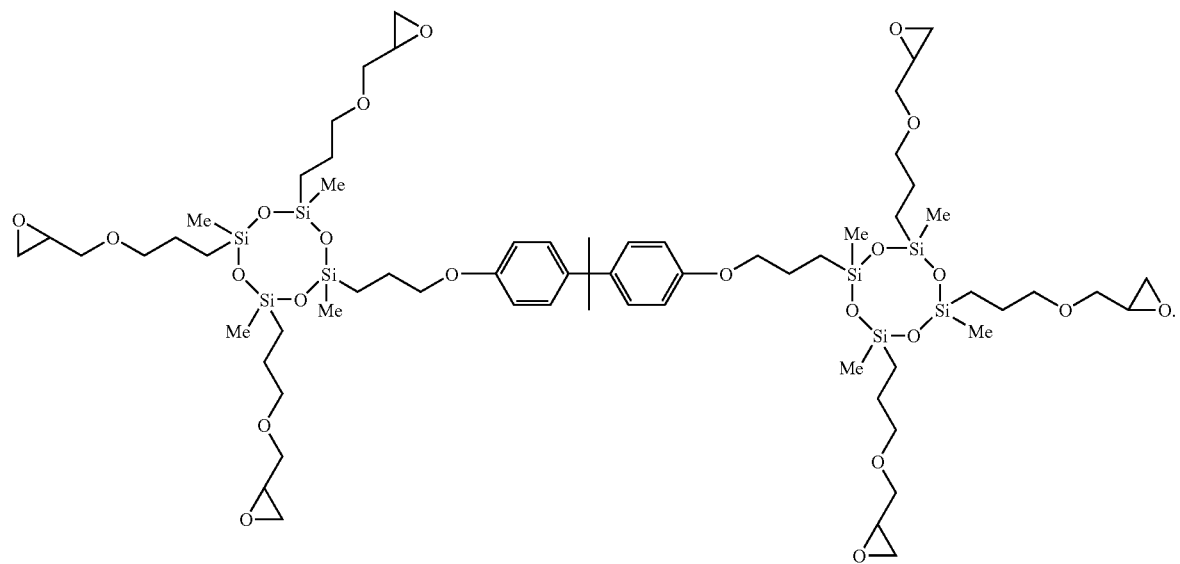

What is claimed is:

1. A compound having the structure:

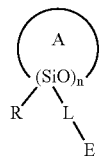

wherein:

A is a siloxane ring, each R is independently selected from the group consisting of $C_1$ to about $C_{20}$ alkyls, each L is independently selected from the group consisting of a substituted or unsubstituted alkylene, a substituted or unsubstituted oxyalkylene, and covalent bond, at least one E is a polymerizable moiety, and n is an integer having the value of between 3 to about 6, with the further proviso that at least one E is different from at least one other E, and that each E is independently selected from the group consisting of maleimide, styrenic, vinyl ester, vinyl ether, itaconate, fumarate, oxetane, oxazoline, benzoxazine, cyanate ester and propargyl ether.

2. The compound of claim 1, wherein each R is independently selected from the group consisting of $C_1$ to about $C_{10}$ alkyls.

3. The compound of claim 1, wherein each R is independently selected from the group consisting of $C_1$ to about $C_5$ alkyls.

4. The compound of claim 1, wherein each R is independently selected from the group consisting of $C_1$ to about $C_3$ alkyls.

5. The compound of claim 1, wherein R is methyl.

6. The compound of claim 1, wherein each L is independently selected from the group consisting of a $C_1$ to about $C_{20}$ substituted or unsubstituted alkylenes or oxyalkylenes.

7. The compound of claim 1, wherein each L is independently selected from the group consisting of a $C_1$ to about $C_{10}$ substituted or unsubstituted alkylenes or oxyalkylenes.

8. The compound of claim 1, wherein substituted or unsubstituted alkylene or oxyalkylene moieties comprise substituents independently selected from the group consisting of alkyl, alkenyl, alkynyl, hydroxy, oxo, alkoxy, mercapto, cycloalkyl, substituted cycloalkyl, heterocyclic, substituted heterocyclic, aryl, substituted aryl, heteroaryl, substituted heteroaryl, aryloxy, substituted aryloxy, halogen, haloalkyl, cyano, nitro, nitrone, amino, amido, —C(O)H, —C(O)—, —S—, —S(O)$_2$—, —OC(O)—O—, —NR—C(O)—, —NR—C(O)—NR—, —OC(O)—NR—, wherein R is selected from the group consisting of H, lower alkyl, acyl, oxyacyl, carboxyl, carbamate, sulfonyl, sulfonamide, and sulfuryl.

9. A compound, having the structure selected from the group consisting of compounds 2, 4-8, and 10-15:

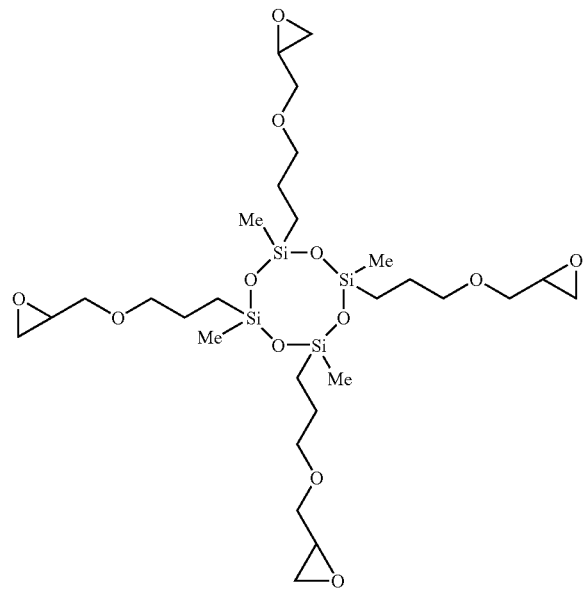
Compound 1
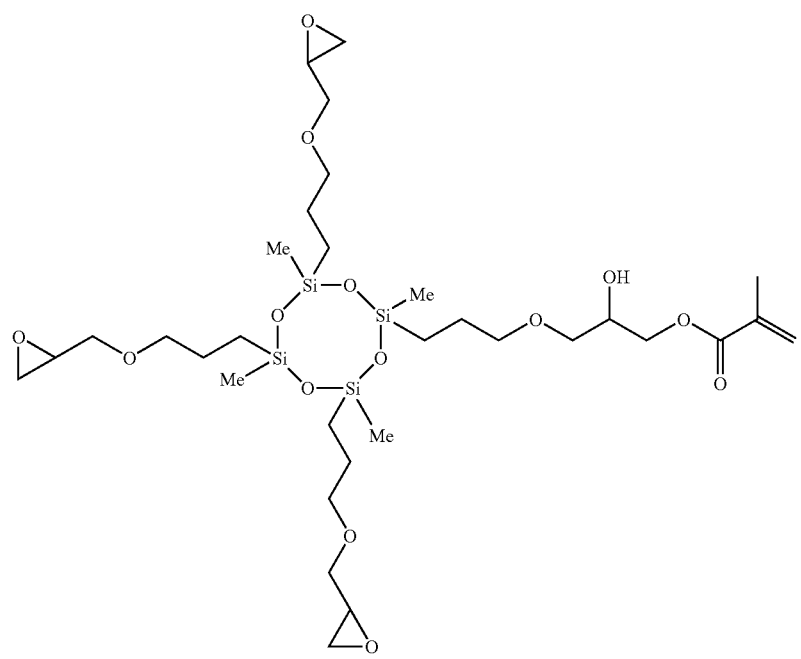
Compound 2